US011794295B2

(12) United States Patent
Yamahata (10) Patent No.: US 11,794,295 B2
(45) Date of Patent: Oct. 24, 2023

(54) INCLINATION ADJUSTING MECHANISM

(71) Applicant: DISCO CORPORATION, Tokyo (JP)

(72) Inventor: Ichiro Yamahata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 552 days.

(21) Appl. No.: 17/141,642

(22) Filed: Jan. 5, 2021

(65) Prior Publication Data

US 2021/0229228 A1 Jul. 29, 2021

(30) Foreign Application Priority Data

Jan. 15, 2020 (JP) ................................. 2020-004273

(51) Int. Cl.
*B23Q 3/04* (2006.01)
*B23Q 3/18* (2006.01)
*B24B 41/06* (2012.01)

(52) U.S. Cl.
CPC ............... *B23Q 3/04* (2013.01); *B23Q 3/186* (2013.01); *B24B 41/068* (2013.01)

(58) Field of Classification Search
None
See application file for complete search history.

(56) References Cited

U.S. PATENT DOCUMENTS

| | | | | |
|---|---|---|---|---|
| 1,092,867 A | * | 4/1914 | Sellew | B23Q 1/54 248/180.1 |
| 2,296,674 A | * | 9/1942 | Ingels | F16M 11/10 248/180.1 |
| 2,676,414 A | * | 4/1954 | Derry | G01C 9/14 33/534 |
| 3,063,155 A | * | 11/1962 | Prefontaine | G01B 5/242 33/537 |
| 3,829,978 A | * | 8/1974 | Basin | G01B 5/0002 269/71 |
| 4,575,942 A | * | 3/1986 | Moriyama | B23Q 1/34 33/1 M |
| 6,705,019 B2 | * | 3/2004 | Mauro | B23Q 1/50 33/569 |
| 8,276,435 B2 | * | 10/2012 | Kanematsu | G01B 5/0004 73/104 |

(Continued)

FOREIGN PATENT DOCUMENTS

| | | | | |
|---|---|---|---|---|
| CN | 108655769 A | * | 10/2018 | |
| CN | 108772729 A | * | 11/2018 | ............... B23Q 3/04 |

(Continued)

*Primary Examiner* — Christopher W Fulton
(74) *Attorney, Agent, or Firm* — Greer Burns & Crain Ltd.

(57) ABSTRACT

There is provided an inclination adjusting mechanism including an annular upper plate that has an upper surface for connecting a table and a lower surface inclined relative to the upper surface, an annular lower plate that has an upper surface parallel to the lower surface of the upper plate and a lower surface parallel to the upper surface of the upper plate and facing an upper surface of a base, an upper rotating mechanism that rotates the upper plate, a lower rotating mechanism that rotates the lower plate, a first bearing provided between the lower surface of the upper plate and the upper surface of the lower plate, a second bearing provided between the lower surface of the lower plate and the upper surface of the base, and a connecting mechanism that connects the upper plate, the lower plate, and the base.

3 Claims, 5 Drawing Sheets

(56) References Cited

U.S. PATENT DOCUMENTS

| | | | | |
|---|---|---|---|---|
| 8,403,731 B2* | 3/2013 | Hirayama | ............ | B24B 41/061 |
| | | | | 451/414 |
| 10,668,594 B2* | 6/2020 | Ando | ............ | B24B 7/228 |
| 11,534,890 B2* | 12/2022 | Hirata | ............ | C30B 33/00 |
| 2020/0384590 A1* | 12/2020 | Yamanaka | ............ | B24B 41/061 |
| 2022/0339753 A1* | 10/2022 | Suzuki | ............ | B24B 37/042 |

FOREIGN PATENT DOCUMENTS

| | | |
|---|---|---|
| JP | 2004082291 A | 3/2004 |
| JP | 2008238341 A | 10/2008 |

\* cited by examiner

INCLINATION ADJUSTING MECHANISM

BACKGROUND OF THE INVENTION

Field of the Invention

The present invention relates to an inclination adjusting mechanism for adjusting an inclination of a holding surface of a chuck table.

Description of the Related Art

A grinding apparatus that grinds a workpiece such as a semiconductor wafer held by a holding surface of a chuck table by a grindstone includes an inclination adjusting mechanism capable of adjusting parallelism of the holding surface relative to a lower surface of the grindstone, as disclosed, for example, in Japanese Patent Laid-Open No. 2004-082291 or Japanese Patent Laid-Open No. 2008-238341.

SUMMARY OF THE INVENTION

In the above-mentioned inclination adjusting mechanism, a lower surface of the chuck table is supported at three points arranged at even intervals in the circumferential direction. Therefore, when the workpiece held on the chuck table is ground by a grindstone while pressing from above, a high load is exerted on the inclination adjusting mechanism, whereby the inclination adjusting mechanism shrinks, and there arises a problem that the inclination, in other words, parallelism, of the holding surface relative to the lower surface of the grindstone would be changed.

Accordingly, it is an object of the present invention to provide an inclination adjusting mechanism by which a situation in which parallelism of a holding surface relative to a lower surface of a grindstone would be changed can be prevented, in the case where a workpiece held on the holding surface is ground while exerting a high load thereon.

In accordance with an aspect of the present invention, there is provided an inclination adjusting mechanism that is disposed between a base of a processing apparatus and a chuck table having a holding surface for holding a workpiece and that adjusts an inclination of the holding surface. The inclination adjusting mechanism includes an annular upper ring plate that has an upper surface for connecting the chuck table and a lower surface inclined relative to the upper surface, an annular lower ring plate that has an upper surface parallel to the lower surface of the upper ring plate and a lower surface parallel to the upper surface of the upper ring plate and facing an upper surface of the base, an upper rotating mechanism that rotates the upper ring plate with a first axis as a rotational axis, the first axis being perpendicular to the inclined lower surface of the upper ring plate and passing through a center of the upper ring plate, a lower rotating mechanism that rotates the lower ring plate with a second axis as a rotational axis, the second axis being perpendicular to the lower surface of the lower ring plate and passing through the center of the upper ring plate, a first bearing between the lower surface of the upper ring plate and the upper surface of the lower ring plate, a second bearing between the lower surface of the lower ring plate and the upper surface of the base, and a connecting mechanism that connects the upper ring plate, the lower ring plate, and the base. The upper ring plate, the lower ring plate, and the base are connected by the connecting mechanism after the inclination of the holding surface is adjusted by rotating one of or both the upper ring plate and the lower ring plate.

Preferably, the first bearing and the second bearing each include an air bearing, and the connecting mechanism causes a flow channel for forming the air bearings to communicate with a suction source.

In addition, preferably, the connecting mechanism includes an electromagnet capable of magnetically attach the upper ring plate, the lower ring plate, and the base to one another.

In the inclination adjusting mechanism according to one aspect of the present invention, the upper ring plate, the lower ring plate, and the base are connected by the connecting mechanism after the inclination of the holding surface is adjusted by rotating one of or both the upper ring plate and the lower ring plate. Therefore, an area for supporting the chuck table is enlarged and rigidity is also enhanced, as compared to an existing inclination adjusting mechanism in which the chuck table is supported by three vertically movable columns or three vertically movable blocks disposed under the chuck table. For this reason, for example, even when a step of grinding a workpiece by a grindstone while exerting a high load is conducted, a situation in which the parallelism of the holding surface relative to the lower surface of the grindstone would be changed during grinding is prevented, and it is possible to make uniform accuracy of a thickness of the workpiece after grinding.

In the case where the first bearing and the second bearing each include an air bearing and a flow channel for forming the first bearing and the second bearing which are air bearings is caused by a connecting mechanism to communicate with a suction source, the first bearing and the second bearing which are air bearings can easily be made to disappear after the inclination of the holding surface is adjusted by rotating one of or both the upper ring plate and the lower ring plate, and, further, the upper ring plate, the lower ring plate, and the base can easily be connected by a suction force generated by the suction source.

In the case where the connecting mechanism includes an electromagnet capable of magnetically attach the upper ring plate, the lower ring plate, and the base to one another, the upper ring plate, the lower ring plate, and the base can easily be connected (magnetically attached) to one another by the connecting mechanism after the inclination of the holding surface is adjusted by rotating one of or both the upper ring plate and the lower ring plate.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
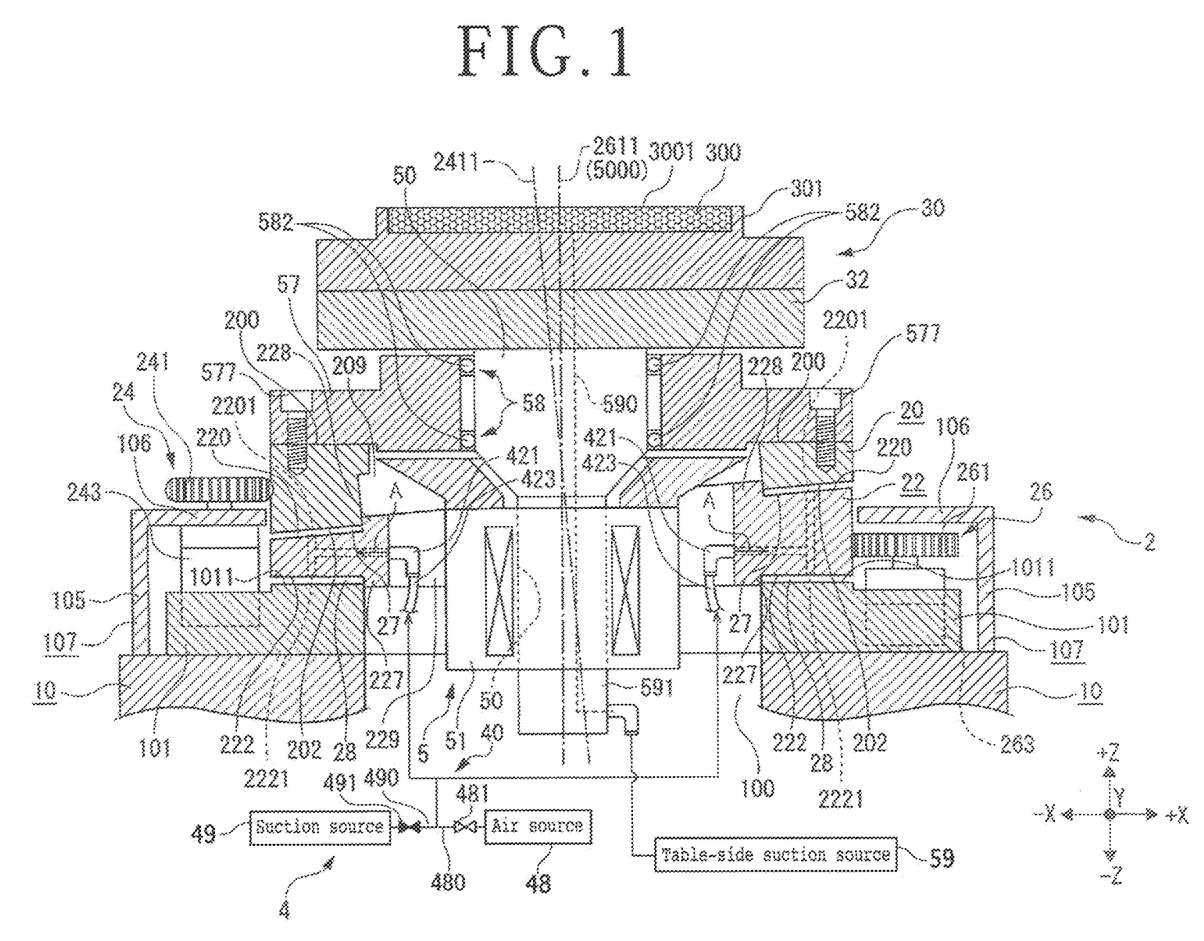
FIG. 1 is a sectional view depicting an example of an inclination adjusting mechanism in a state in which a holding surface is not inclined relative to a horizontal plane.

Preferred embodiments of the present invention will be described below referring to the attached drawings. An inclination adjusting mechanism 2 depicted in FIG. 1 is disposed between a base 10 of a processing apparatus and a chuck table 30 having a holding surface 3001 for holding a workpiece such as a semiconductor wafer and can adjust the inclination of the holding surface 3001.

The inclination adjusting mechanism 2 is disposed in, for example, a grinding apparatus for grinding a workpiece by a rotating grindstone to thin the workpiece or a polishing apparatus for polishing a wafer by a polishing pad including a nonwoven fabric to enhance die strength of the wafer.

The processing apparatus in which to dispose the inclination adjusting mechanism 2 includes, for example, rough grinding means and finish grinding means (not illustrated) and is configured such that the plurality of the chuck tables 30 disposed at even intervals in the circumferential direction on the base 10 which is a rotating turntable, with the center of the base 10 as a center of rotation, can be revolved, and the chuck table 30 can be positioned under the rough grinding means or the finish grinding means.

The base 10 is formed with a circular opening 100, and the base 10 includes an annular base plate 101 disposed such as to surround the opening 100. In the present embodiment, an upper surface 1011 of the base plate 101 is an upper surface 1011 of the base 10. The upper surface 1011 of the base 10 is parallel to a horizontal plane (X-axis and Y-axis plane).

The chuck table 30 includes a suction section 300 that includes a porous member or the like and that holds under suction the workpiece, and a frame body 301 that supports the suction section 300. The suction section 300 of the chuck table 30 communicates with a table-side suction source 59. A suction force generated by suction by the table-side suction source 59 is transmitted to the holding surface 3001 including an exposed surface of the suction section 300 and an upper surface of the frame body 301, whereby the chuck table 30 can hold under suction the workpiece on the holding surface 3001.

The holding surface 3001 is, for example, a conical surface that has the center of rotation of the chuck table 30 as an apex and that is extremely gentle to such an extent that it cannot visually be confirmed by naked eye.

The chuck table 30 is detachably mounted to the upper surface of a disk-shaped table base 32 by fixing bolts (not illustrated) or the like.

The table base 32 is rotatably supported by a table rotating mechanism (table rotating means) 5 that rotates the chuck table 30. In the present embodiment, the chuck table 30 is connected to an upper surface 200 of an upper ring plate 20 (described later) of the inclination adjusting mechanism 2 through the table rotating mechanism 5.

The inclination adjusting mechanism 2 depicted in FIG. 1 is depicted as being in a state in which the holding surface 3001 of the chuck table 30 is not inclined relative to a horizontal plane (X-axis and Y-axis plane) (in a state in which the holding surface 3001 is substantially parallel to the horizontal plane). The inclination adjusting mechanism 2 includes an annular upper ring plate 20 that has an upper surface 200 for connecting the chuck table 30 and a lower surface 202 inclined relative to the upper surface 200, an annular lower ring plate 22 that has an upper surface 220 parallel to the lower surface 202 of the upper ring plate 20 and a lower surface 222 parallel to the upper surface 200 of the upper ring plate 20 and facing an upper surface 1011 of the base 10, an upper rotating mechanism (upper rotating means) 24 that rotates the upper ring plate 20 as a first axis (upper rotational axis) 2411 as a rotational axis, the first axis being perpendicular to the lower surface 202 of the upper ring plate 20 inclined and passing through the center of the upper ring plate 20, a lower rotating mechanism 26 that rotates the lower ring plate 22 with a second axis (lower rotational axis) 2611 as a rotational axis, the second axis being perpendicular to the lower surface 222 of the lower ring plate 22 and passing through the center of the upper ring plate 20, a first bearing 27 between the lower surface 202 of the upper ring plate 20 and the upper surface 220 of the lower ring plate 22, a second bearing 28 between the lower surface 222 of the lower ring plate 22 and the upper surface 1011 of the base 10, and a connecting mechanism (connecting means) 4 that connects the upper ring plate 20, the lower ring plate 22, and the base 10.

As illustrated in FIG. 1, in a state in which the inclination adjusting mechanism 2 does not incline the holding surface 3001 of the chuck table 30 relative to a horizontal plane, the upper surface 200 of the annular upper ring plate 20, formed of a highly rigid metal or the like, is, for example, parallel to a horizontal plane (X-axis and Y-axis plane), and the lower surface 202 inclined at a predetermined angle relative to the upper surface 200 in FIG. 1 is inclined at the predetermined angle relative to a horizontal plane.

A spindle 50 of the table rotating mechanism 5 is inserted in and passed through an opening 209 formed in the center of the upper ring plate 20.

As depicted in FIG. 1, in a state in which the inclination adjusting mechanism 2 does not incline the holding surface 3001 of the chuck table 30 relative to a horizontal plane, the upper surface 220 of the annular lower ring plate 22, formed of a highly rigid metal or the like, is, for example, parallel to the lower surface 202 of the upper ring plate 20 and is inclined at a predetermined angle relative to a horizontal plane. The lower surface 222 of the lower ring plate 22 is a horizontal surface parallel to the upper surface 200 of the upper ring plate 20.

The spindle 50 of the table rotating mechanism 5 is inserted in and passed through an opening 229 formed in the center of the lower ring plate 22. Note that the second axis 2611 described above also passes through the center of the lower ring plate 22.

As described above, the upper ring plate 20 is an inclined ring with the lower surface 202 inclined, and its thickness is continuously reduced from an outer periphery on a −X direction side toward an outer periphery on a +X direction side in FIG. 1, with the center as a reference. In addition, the lower ring plate 22 is an inclined ring with the upper surface 220 inclined, and its thickness is continuously increased from an outer periphery on the −X direction side toward an outer periphery on the +X direction side in FIG. 1, with the center as a reference.

Figure 2:
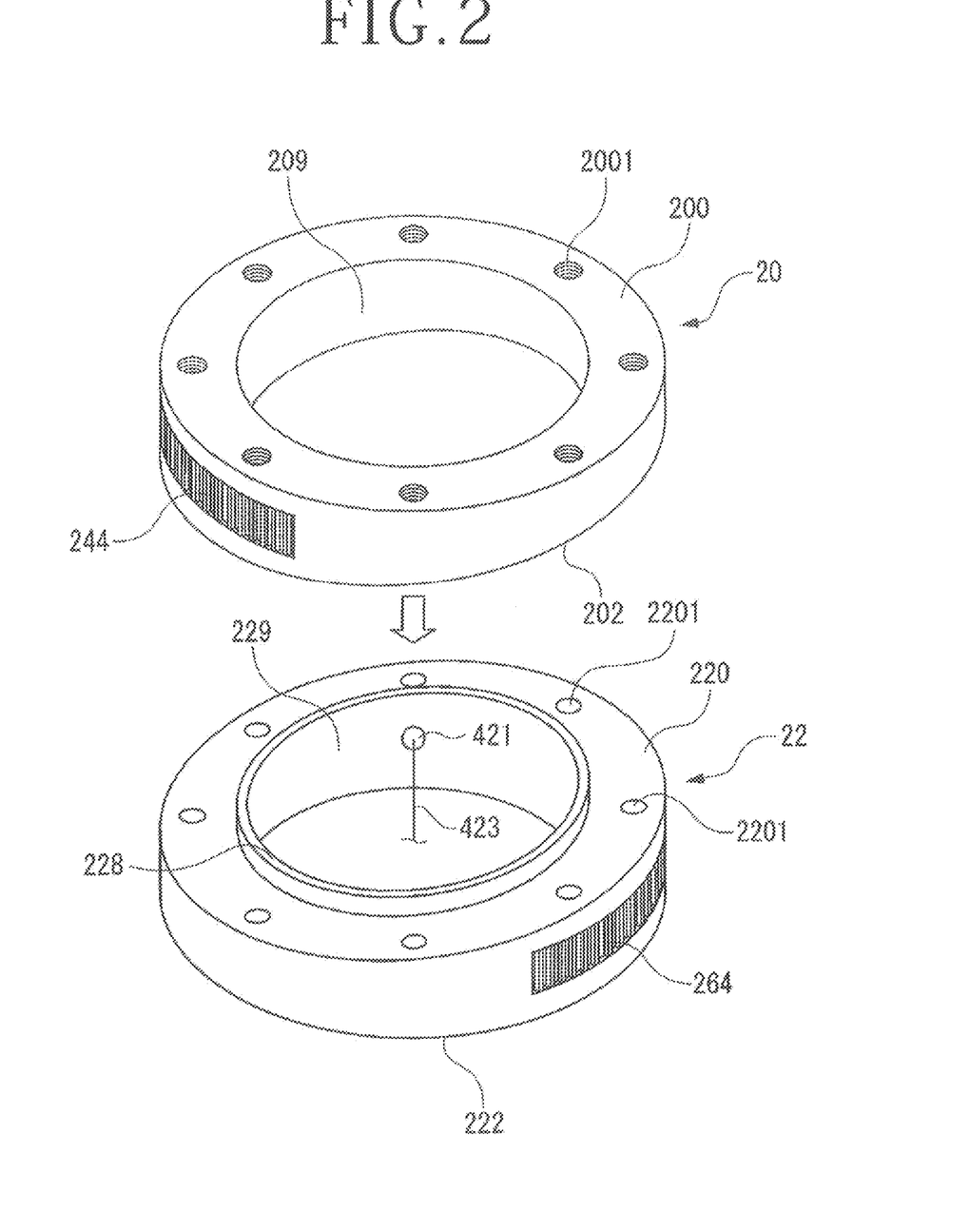
FIG. 2 is a perspective view depicting an example of an upper ring plate and a lower ring plate.

For example, a diameter of the opening 229 of the lower ring plate 22 is smaller than a diameter of the opening 209 of the upper ring plate 20. The upper surface 220 of the lower ring plate 22 is formed, in the periphery of the opening 229, with an annular step projecting one step upward as a deviation inhibiting section 228. An outside surface of the deviation inhibiting section 228 is formed to be vertical to the upper surface 220, so that it can make contact with an inside surface of the upper ring plate 20 when the upper ring plate 20 and the lower ring plate 22 are connected by the connecting mechanism 4. As a result, the upper ring plate 20 and the lower ring plate 22 are inhibited from relatively deviating from each other in a lateral direction (horizontal plane direction). Note that, when the upper ring plate 20 or the lower ring plate 22 is rotated, air jetted out from an upper surface air jetting passage 2201 depicted in FIG. 1 and described later enters between the inside surface of the upper ring plate 20 and an outside surface of the deviation inhibiting section 228, whereby the inside surface of the upper ring plate 20 and the outside surface of the deviation inhibiting section 228 are supported on a non-contact basis and are inhibited from deviating in a lateral direction. In addition, it is possible to prevent ejection of refuse at the time of rotation and seizure at the time of rotation.

The lower surface 222 of the lower ring plate 22 is formed, in the periphery of the opening 229, with an annular step projecting one step downward as a deviation inhibiting section 227. An outside surface of the deviation inhibiting section 227 is formed to be perpendicular to the lower surface 222 of the lower ring plate 22; for example, when the lower ring plate 22 is being rotated, air jetted out from a lower surface air jetting passage 2221 depicted in FIG. 1 and described later enters between the outside surface of the deviation inhibiting section 227 of the lower ring plate 22 and an inside surface of the base plate 101 of the base 10, whereby the outside surface of the deviation inhibiting section 227 of the lower ring plate 22 and the inside surface of the base plate 101 are supported on a non-contact basis and are inhibited from deviating in a lateral direction. In addition, when the lower ring plate 22 and the base 10 are connected by the connecting mechanism 4, the lower ring plate 22 can make contact with the inside surface of the base plate 101 of the base 10, whereby the lower ring plate 22 is inhibited from deviating from the base 10 in a lateral direction.

For example, an outside surface of the upper ring plate 20 is formed with a driven gear 244 (see FIG. 2), and the driven gear 244 is meshed with an active spur gear 241 constituting the upper rotating mechanism 24 depicted in FIG. 1. The active spur gear 241 is attached to a shaft of an upper ring plate driving motor 243. Note that, in the example depicted in FIG. 2, the driven gear 244 is formed in an arcuate shape in the circumferential direction at a part of the outside surface of the upper ring plate 20, but the driven gear 244 may be formed over the whole circumference of the outside surface of the upper ring plate 20.

The upper ring plate driving motor 243 is, for example, disposed on the base plate 101. Note that the outside surface of the active spur gear 241 is desirably formed to be arcuate in a side view, such as to be able to cope with inclination of the outside surface of the upper ring plate 20 which varies according to the inclination of a first axis 2411 varied by rotation of the lower ring plate 22. Note that the driven gear 244 depicted in FIG. 2 may be formed over the whole circumference of the outside surface of the upper ring plate 20, and the active spur gear 241 and the driven gear 244 may be connected by an endless belt.

An outside surface of the lower ring plate 22 is formed with a driven gear 264 (see FIG. 2), and the driven gear 264 is meshed with an active spur gear 261 constituting the lower rotating mechanism 26 depicted in FIG. 1. The active spur gear 261 is attached to a shaft of a lower ring plate driving motor 263. Note that the driven gear 264 is formed in an arcuate shape in the circumferential direction at a part of the outside surface of the lower ring plate 22 in the example depicted in FIG. 2, but the driven gear 264 may be formed over the whole circumference of the outside surface of the lower ring plate 22.

Note that the driven gear 264 formed over the whole circumference of the outside surface of the lower ring plate 22 and the active spur gear 261 may be connected by an endless belt.

The lower ring plate driving motor 263 depicted in FIG. 1 is, for example, fixed on the base plate 101. Note that the lower ring plate driving motor 263 may be, for example, fixed to a top plate 106 of a waterproof cover 107 which will be described later.

For example, a cylindrical side plate 105 is erected in a region on an outer circumference side on the base 10 depicted in FIG. 1, and the top plate 106 extends from an upper end of the side plate 105 toward a radial-directionally inner side. The top plate 106 and the side plate 105 constitute the waterproof cover 107. When processing water supplied to processing means including a grinding wheel or the like of a processing apparatus flows down from on the chuck table 30 at the time of grinding, the waterproof cover 107 protects the upper ring plate driving motor 243 and the lower ring plate driving motor 263 from the processing water and protects a motor 51 of the table rotating mechanism 5 from the processing water.

As illustrated in FIG. 1, the table rotating mechanism 5 is, for example, disposed in the manner of being accommodated in a substantially cylindrical space formed by the opening 209 in the center of the upper ring plate 20, the opening 229 in the center of the lower ring plate 22, the opening in the center of the base plate 101, and the opening 100 in the center of the base 10.

Figure 3:
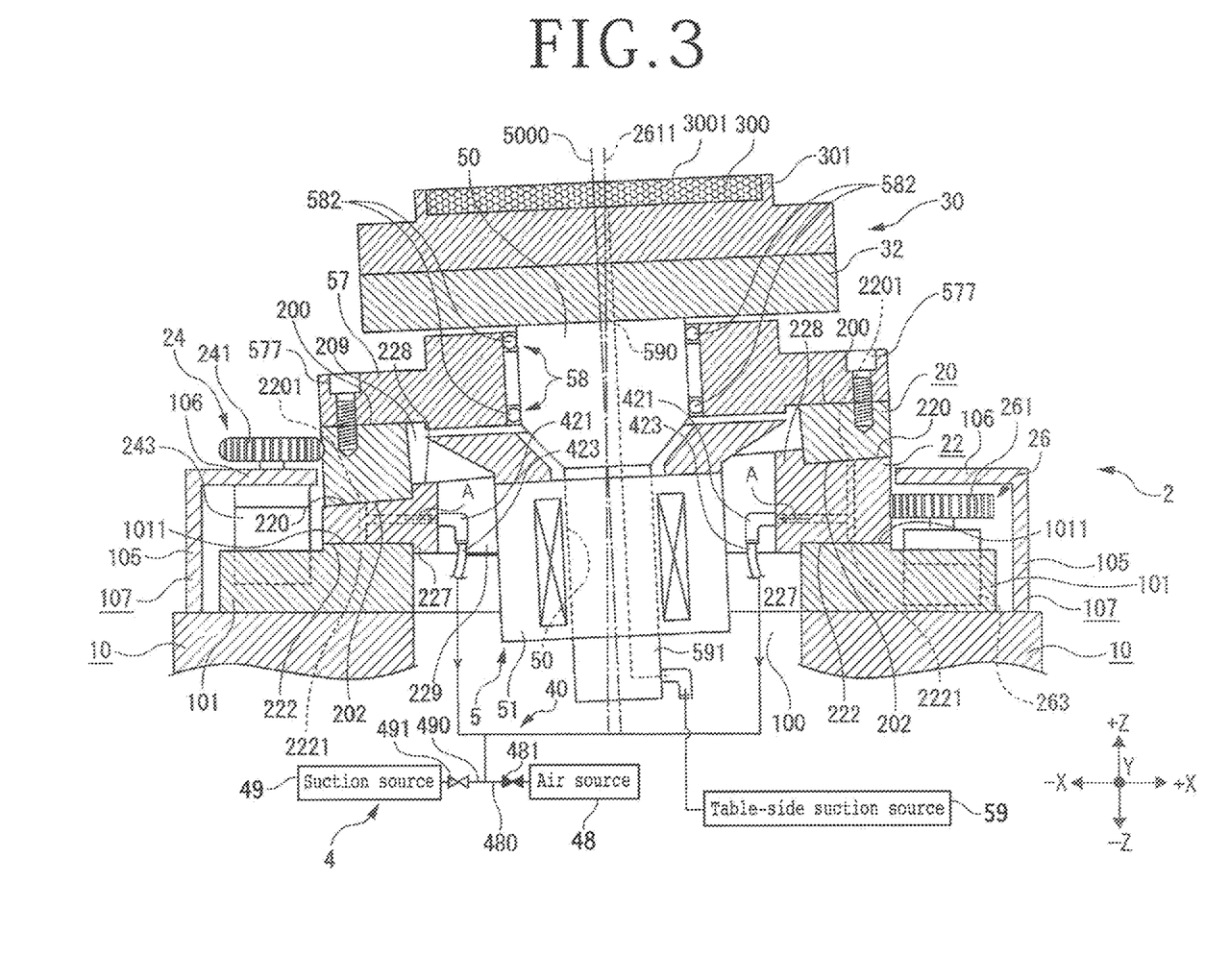
FIG. 3 is a sectional view depicting an example of the inclination adjusting mechanism in a state in which the holding surface is inclined relative to a horizontal plane.

The table rotating mechanism 5 includes, for example, the spindle 50 extending in the vertical direction in the above-mentioned substantially cylindrical space. The spindle 50 is supported by the upper ring plate 20 and can be rotated by the motor 51 with a spindle axis 5000 (in FIG. 1, the same axis as the second axis 2611) as a rotational axis. The substantially cylindrical space is formed in such a size as to permit the spindle 50, extending in the Z-axis direction such as to be orthogonal to a horizontal plane in FIG. 1, to incline as depicted in FIG. 3. A lower surface of the table base 32 is connected to an upper end of the spindle 50.

The motor 51 is, for example, a direct drive motor (DD motor), which, due to the absence of a speed reducing mechanism, is excellent in speed and response (high speed and high response) and is suitable for a reduction in size of the whole part of the table rotating mechanism 5. Note that the motor 51 is not limited to the DD motor.

As illustrated in FIG. 1, a suction channel 590 communicating with the suction section 300 is formed over the range of a bottom surface of a recess in the frame body 301 to a lower portion side of the spindle 50 of the table rotating mechanism 5. The suction channel 590 communicates with the table-side suction source 59 such as an ejector mechanism or a vacuum generation unit through a table-side rotary joint 591 disposed on the lower portion side of the spindle 50. The table-side rotary joint 591 transmits a suction force generated by the table-side suction source 59 to the rotating spindle 50 side without omission.

The table rotating mechanism 5 includes a bearing mechanism 58 that rotatably supports the spindle 50, and a support plate 57 that supports the bearing mechanism 58. While the bearing mechanism 58 is a thrust ball bearing mechanism in the example depicted in FIG. 1, the bearing mechanism 58 may be a roller bearing mechanism or an air bearing mechanism.

The bearing mechanism 58 includes, for example, an outer ring (not illustrated), an inner ring having an insertion hole in and through which the spindle 50 is inserted and passed, a rolling body holder, rolling bodies 582 such as balls. In the example illustrated, two bearing mechanisms 58 are provided at upper and lower positions on the upper portion side of the spindle 50, but this is not limitative.

For example, plural bolt passing holes (not illustrated) in and through which fixing bolts 577 are inserted and passed are formed in a region on the outer circumference side of the support plate 57 having a substantially circular plate shape in plan view, at even intervals in the circumferential direction and such as to penetrate the support plate 57 in the thickness direction. The bolt passing holes and female screw holes 2001 (see FIG. 2) formed in the upper surface 200 of the upper ring plate 20 are overlapped with each other, and the fixing bolts 577 are passed through the bolt passing holes and screw engaged with the female screw holes 2001, whereby the support plate 57 is fixed to the upper surface 200 of the upper ring plate 20.

In the present embodiment, the first bearing 27 between the lower surface 202 of the upper ring plate 20 and the upper surface 220 of the lower ring plate 22 and the second bearing 28 between the lower surface 222 of the lower ring plate 22 and the upper surface 1011 of the base 10, depicted in FIG. 1, include air bearings. The connecting mechanism 4 is configured to cause a flow channel 40 for forming the first bearing 27 and the second bearing 28 which are air bearings to communicate with the suction source 49 depicted in FIG. 1. Hereinafter, the connecting mechanism 4 will be a connecting mechanism 4 in the first embodiment.

For example, as depicted in FIG. 1, the upper surface 220 of the lower ring plate 22 is formed with an upper surface air jetting passage 2201 for jetting air A toward the upper side, at even intervals in the circumferential direction. In addition, the lower surface 222 of the lower ring plate 22 is formed with lower surface air jetting passages 2221 for jetting air A toward the lower side, at even intervals in the circumferential direction. The upper surface air jetting passage 2201 and the lower surface air jetting passage 2221, for example, join each other in the inside of the lower ring plate 22, are opened at a plurality of positions of the inside surface of the lower ring plate 22, and communicate with a resin tube 423 being flexible so as not to hinder rotation of the lower ring plate 22, through a hose nipple, a joint, a rotary joint 421 and the like.

Note that, while the openings of the upper surface air jetting passage 2201 and the lower surface air jetting passage 2221 at the inside surface of the lower ring plate 22 are depicted only at one part in FIG. 2, the openings are opening at a plurality of parts instead of only one part, and one end side of the resin tube 423 communicates with each of the openings through the rotary joint 421 and the like.

The other end side of the resin tube 423 is branched through a three-way pipe (not illustrated) and communicates with one end of a suction pipe 490 and one end of an air supply pipe 480 depicted in FIG. 1.

The other end side of the suction pipe 490 is connected to the suction source 49 such as a vacuum generation unit or an ejector mechanism. For example, a suction on-off valve 491 such as a solenoid valve capable of controlling (opening and closing) the communication and interruption of communication between the flow channel 40 and the suction source 49 is disposed in the suction pipe 490.

The other end side of the air supply pipe 480 is connected to the air source 48 including a compressor or the like. For example, an air supply on-off valve 481 such as a solenoid valve capable of controlling (opening and closing) the communication and interruption of communication between the flow channel 40 and the air source 48 is disposed in the air supply pipe 480.

In the present embodiment, the upper surface air jetting passage 2201, the lower surface air jetting passage 2221, the rotary joint 421 and the like, the resin tube 423, and the air supply pipe 480 described above form the flow channel 40 for realizing the first bearing 27 and the second bearing 28 which are air bearings.

An operation in the case of adjusting the inclination of the holding surface 3001 of the chuck table 30 by use of the inclination adjusting mechanism 2 depicted in FIG. 1 to obtain a state in which a workpiece can be held under suction and be processed, and the like, will be described below.

For example, the workpiece (not illustrated) is placed on the holding surface 3001, and a suction force generated by the table-side suction source 59 is transmitted to the holding surface 3001, whereby a state in which the workpiece is held under suction by the holding surface 3001 of the chuck table 30 is realized.

For example, first, as illustrated in FIG. 1, the first bearing 27 which is an air bearing is formed between the lower surface 202 of the upper ring plate 20 and the upper surface 220 of the lower ring plate 22, and the second bearing 28 which is an air bearing is formed between the lower surface 222 of the lower ring plate 22 and the upper surface 1011 of the base 10. In other words, the air supply on-off valve 481 is put into an open state, and compressed air sent out by the air source 48 is jetted toward the lower surface 202 of the upper ring plate 20 and the upper surface 1011 of the base plate 101 of the base 10 by passing through the air supply pipe 480, the resin tube 423, the upper surface air jetting passage 2201, and the lower surface air jetting passage 2221.

As a result, the first bearing 27 is formed as an air bearing between the lower surface 202 of the upper ring plate 20 and the upper surface 220 of the lower ring plate 22, and the second bearing 28 is formed as an air bearing between the lower surface 222 of the lower ring plate 22 and the upper surface 1011 of the base 10. In other words, the upper ring plate 20 is supported on a non-contact and floated basis by the first bearing 27 and can be rotated, and the lower ring plate 22 is supported on a non-contact and floated basis by the second bearing 28 and can be rotated.

The air having formed the first bearing 27 and the second bearing 28 passes successively to the outside of the lower ring plate 22 and the opening 229 side.

Next, one of or both (at least either one of) the upper ring plate 20 and the lower ring plate 22 are rotated. While, for example, only the upper ring plate 20 is rotated in the present embodiment, only the lower ring plate 22 may be rotated, or both the upper ring plate 20 and the lower ring plate 22 may be rotated.

Note that, with the lower ring plate 22 rotated, the inclining direction of the first axis 2411 relative to the upper surface of the lower ring plate 22 is varied. The inclination of the lower surface 202 of the upper ring plate 20 is also varied according to the inclination of the first axis 2411.

A rotational driving force generated by the upper ring plate driving motor 243 depicted in FIG. 1 is transmitted to the active spur gear 241 and the driven gear 244 (see FIG. 2), whereby the support plate 57 of the table rotating mechanism 5 is rotated together with the upper ring plate 20.

Therefore, at each position in the circumferential direction of the lower ring plate 22, the thickness of the opposite upper ring plate 20 gradually varies.

After the upper ring plate 20 is rotated by a predetermined angle such that the holding surface 3001 can be inclined by a predetermined angle relative to a horizontal plane, the rotation of the upper ring plate 20 is stopped.

Further, as depicted in FIG. 3, the air supply on-off valve 481 is closed, whereby communication of the flow channel 40 with the air source 48 is interrupted, and the first bearing 27 and the second bearing 28 depicted in FIG. 1 which are air bearings disappear. As a result, the lower surface 222 of the lower ring plate 22 is seated on the upper surface 1011 of the base 10. Further, the lower surface 202 of the upper ring plate 20 is seated on the upper surface 220 of the lower ring plate 22 such as to be flush with the upper surface 220. Then, the spindle 50 connected to the upper ring plate 20 through the support plate 57 and the bearing mechanism 58 of the table rotating mechanism 5 is brought from a state of being orthogonal to the horizontal plane depicted in FIG. 1 (a state of extending in parallel to the Z-axis direction) to a state of being inclined at a predetermined angle relative to the horizontal plane. In addition, the angle of the holding surface 3001 of the chuck table 30 connected to the upper end of the spindle 50 through the table base 32 is also brought from a state of being parallel to the horizontal plane depicted in FIG. 1 to a state of being inclined by a desired angle as depicted in FIG. 3.

Further, as illustrated in FIG. 3, the suction on-off valve 491 is opened, a suction force generated by the suction source 49 is transmitted to the upper surface 220 and the lower surface 222 of the lower ring plate 22 through the suction pipe 490, the resin tube 423, the upper surface air jetting passage 2201, and the lower surface air jetting passage 2221, the upper ring plate 20 and the lower ring plate 22 are suction fixed by the suction force, and the lower ring plate 22 and the base 10 are suction fixed. In other words, a state in which the upper ring plate 20, the lower ring plate 22, and the base 10 are connected by the connecting mechanism 4 is obtained.

In the present embodiment, lateral deviation of the upper ring plate 20 and the lower ring plate 22 is prevented by the deviation inhibiting section 228 depicted in FIG. 3, and lateral deviation of the lower ring plate 22 and the base 10 is prevented by the deviation inhibiting section 227.

In the case where the workpiece is held by the chuck table 30 of which the inclination of the holding surface 3001 has been adjusted to a desired angle and the workpiece is ground by processing means (not illustrated), as illustrated in FIG. 3, the motor 51 rotates the spindle 50 rotatably supported by the bearing mechanism 58, whereby the chuck table 30 connected to the spindle 50 is also rotated.

In the inclination adjusting mechanism 2, after one of or both the upper ring plate 20 and the lower ring plate 22 are rotated to adjust the inclination of the holding surface 3001, the upper ring plate 20, the lower ring plate 22, and the base 10 are connected by the connecting mechanism 4, whereby an area for supporting the chuck table 30 is enlarged and rigidity is enhanced, as compared to an existing inclination adjusting mechanism in which a chuck table is supported by three vertically movable columns disposed under the chuck table or three vertically movable blocks and the inclination of the holding surface can be adjusted. Therefore, for example, even when the workpiece held by the chuck table 30 is ground by processing means including a grindstone or the like under a high load, a situation in which parallelism of the holding surface 3001 relative to the lower surface of the grindstone would be changed during grinding is prevented, and it is possible to make uniform the accuracy of the thickness of the workpiece after grinding.

In addition, the first bearing 27 and the second bearing 28 include air bearings as depicted in FIG. 1, and the flow channel 40 for forming the first bearing 27 and the second bearing 28 which are air bearings is caused by the connecting mechanism 4 to communicate with the suction source 49; therefore, after one of or both the upper ring plate 20 and the lower ring plate 22 are rotated to adjust the inclination of the holding surface 3001 of the chuck table 30, the first bearing 27 and the second bearing 28 which are air bearings can easily be made to disappear as depicted in FIG. 3, and, further, the upper ring plate 20, the lower ring plate 22, and the base 10 can easily be connected by the suction force generated by the suction source 49.

It is natural that the inclination adjusting mechanism 2 according to the present invention is not limited to the abovementioned embodiment, and the invention can be carried out with various modes within the scope of the technical thought thereof. In addition, the configurations of the base 10 and the chuck table 30 of the processing apparatus depicted in the attached drawings, and the like are not limited to the illustrated, and appropriate modifications are possible within such ranges that the effect of the present invention can be produced.

Figure 4:
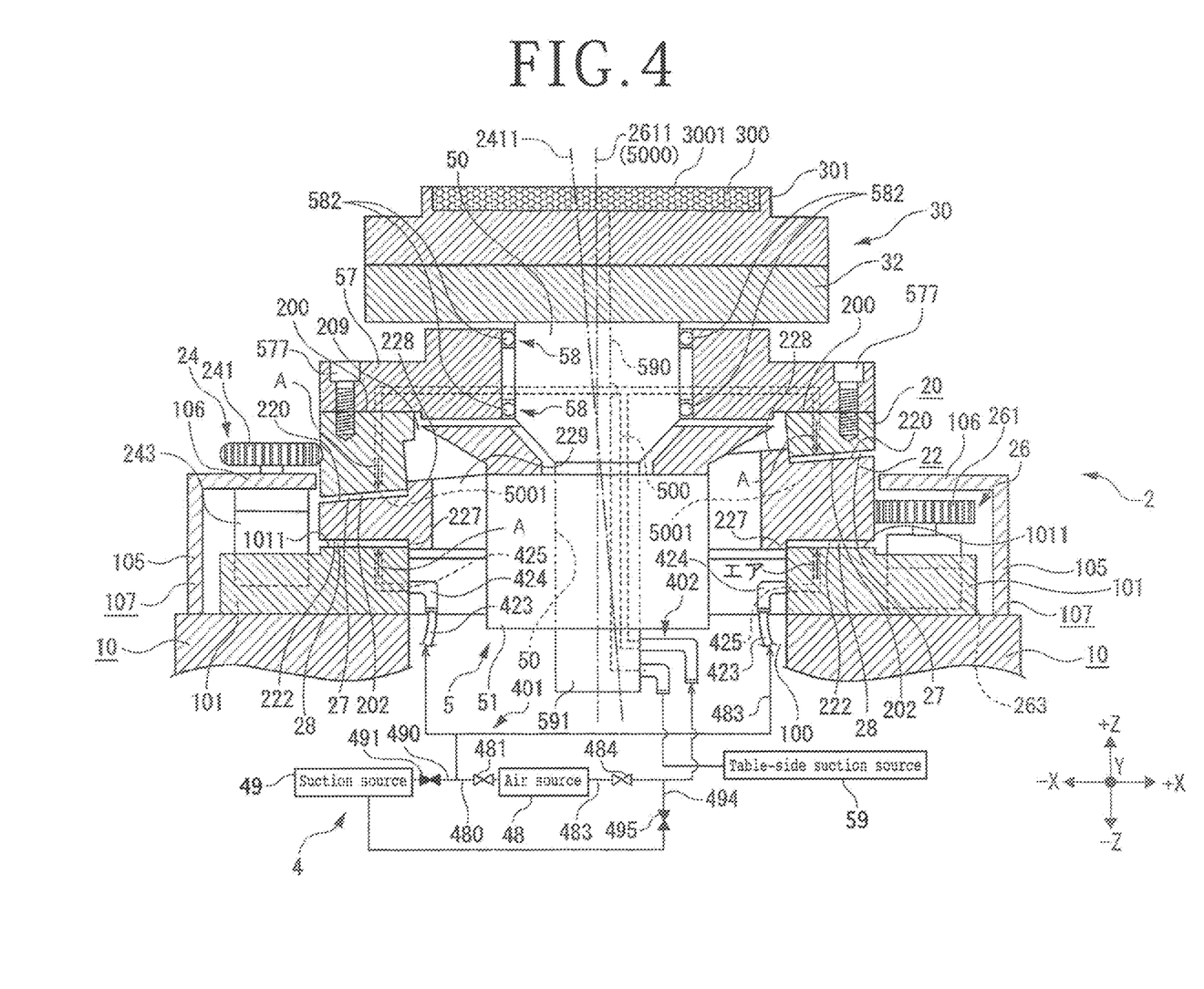
FIG. 4 is a sectional view depicting an inclination adjusting mechanism including a first flow channel for forming a first bearing which is an air bearing and a second flow channel for forming a second bearing which is an air bearing.

For example, in the connecting mechanism 4 of the first embodiment, the flow channel for forming the first bearing 27 and the second bearing 28 which are air bearings may be formed as a second flow channel 401 and a first flow channel 402 depicted in FIG. 4, in place of the flow channel 40 illustrated in FIGS. 1 and 3. Note that the inclination adjusting mechanism 2 in FIG. 4 is depicted in a state before the holding surface 3001 of the chuck table 30 is inclined relative to a horizontal plane.

For example, in an example illustrated in FIG. 4, the second flow channel 401 is a flow channel for forming the second bearing 28 which is an air bearing and includes the air supply pipe 480, the resin tube 423, the joint 424, and a second air jetting passage 425 formed in the base plate 101 and opening on the upper surface 1011. Compressed air A is jetted from the opening of the second air jetting passage 425 at the upper surface 1011 to the lower surface 222 of the lower ring plate 22, to form the second bearing 28 that supports the lower ring plate 22 in a floating manner between the lower surface of the lower ring plate 22 and the upper surface 1011 of the base 10.

The first flow channel 402 depicted in FIG. 4 is a flow channel for forming the first bearing 27 which is an air bearing and is configured as described below.

For example, one end of a first air supply pipe 483 depicted in FIG. 4 communicates with the air source 48, and a first air supply on-off valve 484 is disposed on the first air supply pipe 483. The other end side of the first air supply pipe 483 communicates, for example, with a lower end side (one end side) of an in-spindle supply passage 500 formed in the spindle 50 through the table-side rotary joint 591.

For example, the in-spindle supply passage 500 is branched into a plurality of passages at an upper portion of the spindle 50 toward radial-directionally outer sides of the spindle 50, and the other end sides of the in-spindle supply passages 500 branched into a plurality of passages pass through the support plate 57 and the upper ring plate 20 and are opening as first air jetting ports 5001 in the lower surface 202 of the upper ring plate 20. Compressed air A is jetted from the first air jetting ports 5001 to the upper surface 220 of the lower ring plate 22, to form the first bearing 27 that supports the upper ring plate 20 in a floating manner.

Note that the first flow channel 402 may be connected, for example, with the first air supply pipe 483 including a resin tube or the like directly through a rotary joint or the like, without passing through the inside of the spindle 50 or the like, such that compressed air A can be jetted from the first air jetting ports 5001 in the lower surface 202 of the upper ring plate 20.

For example, a first air suction pipe 494 communicates with a downstream side of the first air supply pipe 483 relative to the first air supply on-off valve 484 through a three-way pipe (not illustrated) or the like, and the first air suction pipe 494 communicates with the suction source 49. A first air on-off valve 495 is disposed in the first air suction pipe 494.

In the inclination adjusting mechanism 2 illustrated in FIG. 4, in the case where the upper ring plate 20, the lower ring plate 22, and the base 10 are connected by the connecting mechanism 4 after one of or both the upper ring plate 20 and the lower ring plate 22 are rotated to adjust the inclination of the holding surface 3001 of the chuck table 30, the suction force generated by the suction source 49 is transmitted to the lower surface 202 of the upper ring plate 20 through the first air suction pipe 494, that part of the first air supply pipe 483 which is on the downstream side relative to the first air supply on-off valve 484, and the in-spindle supply passage 500, and the suction force generated by the suction source 49 is transmitted to the upper surface 1011 of the base 10 through the suction pipe 490, the resin tube 423, and the second air jetting passage 425.

The connecting mechanism 4 of the inclination adjusting mechanism 2 is not limited to, for example, the configuration depicted in FIG. 3. The inclination adjusting mechanism 2 may include, for example, a connecting mechanism (connecting means) 41 illustrated in FIG. 5. Hereinafter, the connecting mechanism 41 will be the connecting mechanism 41 in the second embodiment.

While the connecting mechanism 4 in the first embodiment depicted in FIG. 3 has a configuration in which the flow channel 40 communicates with the suction source 49 and the upper ring plate 20, the lower ring plate 22, and the base 10 are connected by the suction source generated by the suction source 49, the connecting mechanism 41 in the second embodiment includes an electromagnet 45 capable of magnetically attaching the upper ring plate 20, the lower ring plate 22, and the base 10 to one another.

For example, the lower ring plate 22 includes a material which is highly rigid and is attracted by a magnetic force (for example, a metal such as iron, cobalt, and nickel or a ceramic such as ferrite).

Figure 5:
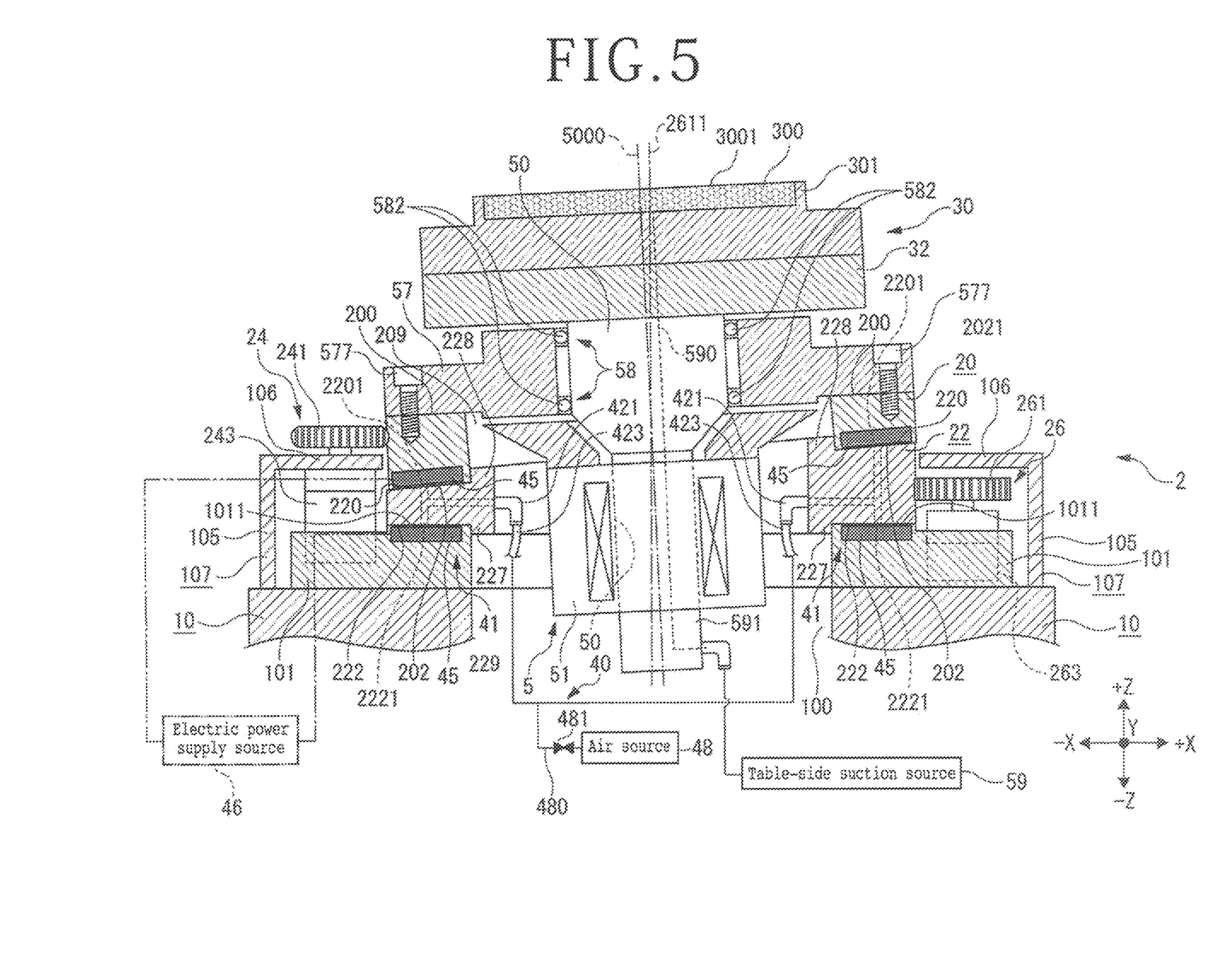
FIG. 5 is a sectional view depicting a state in which the upper ring plate, the lower ring plate, and a base are connected by magnetic forces by a connecting mechanism.

The electromagnet 45 has a configuration in which, for example, a coil is wound around a soft iron core, and the plural electromagnets 45 are disposed on the lower surface 202 side in the inside of the upper ring plate 20 at even intervals in the circumferential direction. In addition, a plurality of the electromagnets 45 are disposed on the upper surface 1011 side in the inside of the base plate 101 of the base 10 at even intervals in the circumferential direction. Note that the electromagnet 45 may be formed, for example, in an annular shape in the upper ring plate 20 (the base plate 101 of the base 10) such as to extend along the circumference of the upper ring plate 20 (the base plate 101).

An electric power supply source 46 is connected to the coil of each electromagnet 45.

In the inclination adjusting mechanism 2 depicted in FIG. 5, after an adjustment for inclining the holding surface 3001 of the chuck table 30 relative to a horizontal plane is conducted, electric power is supplied from the electric power supply source 46 to each electromagnet 45 of the connecting mechanism 41, whereby each electromagnet 45 generates a magnetic force. Then, the upper ring plate 20 is magnetically attached to the lower ring plate 22, and the lower ring plate 22 is magnetically attached to the base 10. In other words, the upper ring plate 20, the lower ring plate 22, and the base 10 can easily be put into a connected state by the connecting mechanism 41.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An inclination adjusting mechanism that is disposed between a base of a processing apparatus and a chuck table having a holding surface for holding a workpiece and that adjusts an inclination of the holding surface, the inclination adjusting mechanism comprising:
  an annular upper ring plate that has an upper surface for connecting the chuck table and a lower surface inclined relative to the upper surface;
  an annular lower ring plate that has an upper surface parallel to the lower surface of the upper ring plate and a lower surface parallel to the upper surface of the upper ring plate and facing an upper surface of the base;
  an upper rotating mechanism that rotates the upper ring plate with a first axis as a rotational axis, the first axis being perpendicular to the inclined lower surface of the upper ring plate and passing through a center of the upper ring plate;
  a lower rotating mechanism that rotates the lower ring plate with a second axis as a rotational axis, the second axis being perpendicular to the lower surface of the lower ring plate and passing through the center of the upper ring plate;
  a first bearing between the lower surface of the upper ring plate and the upper surface of the lower ring plate;
  a second bearing between the lower surface of the lower ring plate and the upper surface of the base; and
  a connecting mechanism that connects the upper ring plate, the lower ring plate, and the base,
  wherein the upper ring plate, the lower ring plate, and the base are connected by the connecting mechanism after the inclination of the holding surface is adjusted by rotating one of or both the upper ring plate and the lower ring plate.

2. The inclination adjusting mechanism according to claim 1,
  wherein the first bearing and the second bearing each include an air bearing, and
  the connecting mechanism causes a flow channel for forming the air bearings to communicate with a suction source.

3. The inclination adjusting mechanism according to claim 1,
  wherein the connecting mechanism includes an electromagnet capable of magnetically attach the upper ring plate, the lower ring plate, and the base to one another.

* * * * *